US009299456B2

(12) United States Patent
Drapala et al.

(10) Patent No.: US 9,299,456 B2
(45) Date of Patent: *Mar. 29, 2016

(54) MATRIX AND COMPRESSION-BASED ERROR DETECTION

(71) Applicant: International Business Machines Corporation, Armonk, NY (US)

(72) Inventors: Garrett M. Drapala, Poughkeepsie, NY (US); Gary E. Strait, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/501,676

(22) Filed: Sep. 30, 2014

(65) Prior Publication Data

US 2015/0261638 A1    Sep. 17, 2015

Related U.S. Application Data

(63) Continuation of application No. 14/205,910, filed on Mar. 12, 2014.

(51) Int. Cl.

| G11C 29/04 | (2006.01) |
|---|---|
| G11C 29/12 | (2006.01) |
| G11C 29/40 | (2006.01) |
| G06F 11/273 | (2006.01) |
| G11C 29/42 | (2006.01) |
| G11C 29/44 | (2006.01) |
| G11C 29/52 | (2006.01) |

(52) U.S. Cl.
CPC ............. *G11C 29/04* (2013.01); *G06F 11/273* (2013.01); *G11C 29/12* (2013.01); *G11C 29/40* (2013.01); *G11C 29/42* (2013.01); *G11C 29/44* (2013.01); *G11C 29/52* (2013.01)

(58) Field of Classification Search
CPC .......... G11C 29/04; G11C 29/12; G11C 29/40
See application file for complete search history.

(56) References Cited

U.S. PATENT DOCUMENTS

| 4,547,882 A | * | 10/1985 | Tanner .......................... 714/755 |
| 4,601,033 A | | 7/1986 | Whelan |
| 4,801,870 A | | 1/1989 | Eichelberger et al. |
| 4,953,164 A | * | 8/1990 | Asakura et al. ............... 714/754 |

(Continued)

OTHER PUBLICATIONS

W. Jones, "Built-in-Self-Test", Dr. Wen-Ben Jone, Associate Professor, Department of ECECS University of Cincinnati, Cincinnati, OH; Spring 2008; pp. 1-54.

*Primary Examiner* — Joseph D Torres
(74) *Attorney, Agent, or Firm* — Cantor Colburn LLP; Margaret McNamara

(57) ABSTRACT

Embodiments relate to matrix and compression-based error detection. An aspect includes summing, by each of a first plurality of summing modules of a first compressor, a respective row of a matrix, the matrix comprising a plurality of rows and a plurality of columns of output bits of a circuit under test wherein each output bit of the circuit under test comprises an element of the matrix, and is a member of a row of a column that is orthogonal to the row. Another aspect includes summing, by each of a second plurality of summing modules of a second compressor, a respective column of output bits of the matrix. Yet another aspect includes determining a presence of an error in the circuit under test based at least one of an output of the first compressor and an output of the second compressor.

13 Claims, 13 Drawing Sheets

(56) References Cited

U.S. PATENT DOCUMENTS

| | | |
|---|---|---|
| 5,170,400 A | 12/1992 | Dotson |
| 5,301,199 A | 4/1994 | Ikenaga et al. |
| 5,485,467 A | 1/1996 | Golnabi |
| 5,488,615 A | 1/1996 | Kunoff et al. |
| 5,784,383 A | 7/1998 | Meaney |
| 6,311,311 B1 | 10/2001 | Swaney et al. |
| 6,675,318 B1 | 1/2004 | Lee |
| 6,782,501 B2 | 8/2004 | Distler et al. |
| 6,978,343 B1 * | 12/2005 | Ichiriu .................. 711/108 |
| 7,134,066 B2 | 11/2006 | Hassner et al. |
| 7,246,288 B2 | 7/2007 | Casarsa |
| 7,461,312 B2 | 12/2008 | Tardif et al. |
| 7,770,096 B1 | 8/2010 | Beard et al. |
| 7,865,770 B2 | 1/2011 | Quach |
| 8,522,097 B2 | 8/2013 | Kim et al. |
| 2003/0065973 A1 * | 4/2003 | Vollrath et al. .................. 714/7 |
| 2006/0256615 A1 * | 11/2006 | Larson .................. 365/185.09 |
| 2007/0011537 A1 | 1/2007 | Kiryu et al. |
| 2008/0072111 A1 | 3/2008 | Le et al. |
| 2008/0168225 A1 * | 7/2008 | O'Connor .................. 711/114 |
| 2008/0256420 A1 * | 10/2008 | Hafner et al. .................. 714/770 |
| 2008/0270869 A1 * | 10/2008 | Hirabayashi .................. 714/764 |
| 2008/0285476 A1 * | 11/2008 | Rajakarunanayake .......... 370/252 |
| 2009/0006886 A1 * | 1/2009 | O'Connor et al. .................. 714/5 |
| 2010/0169742 A1 * | 7/2010 | Hopkins .................. 714/764 |
| 2011/0055646 A1 * | 3/2011 | Mukherjee et al. .......... 714/719 |
| 2012/0317576 A1 | 12/2012 | Mueller et al. |

\* cited by examiner

MATRIX AND COMPRESSION-BASED ERROR DETECTION

CROSS-REFERENCE TO RELATED APPLICATION

This application is a continuation of U.S. application Ser. No. 14/205,910 (Drapala et al.), filed on Mar. 12, 2014, which is herein incorporated by reference in its entirety.

BACKGROUND

The present invention relates generally to computer systems, and more specifically, to matrix and compression-based error detection for a computer system.

A computer system may include multiple copies of the same logic. These copies may have outputs that are supposed to track one another, and may be compared in order to determine whether there is an error in any of the logic. A Multiple Input Signature Register (MISR) may be used to monitor the logic outputs to determine the presence of errors. A mainframe computer may include chips with MISRs which are provided for various manufacturing tests to test for quality assurance of the hardware. Another use of MISRs is for error checking in processors where data is partitioned across one or more chips. U.S. Pat. No. 5,784,383 (Meaney), which is herein incorporated by reference in its entirety, illustrates a method which uses a MISR which permits detecting of errors across chip boundaries due to a hardware failure in control logic even though a processor's error checking code (ECC) is not bad. A MISR on each bus is used to collect a dynamic signature representing all the critical buses on each chip that need to be compared. The MISR state combines present and previous states of these buses, so for the testing in accordance with the method of U.S. Pat. No. 5,784,383 the MISR will be different if one or more bus controls break or are broken. Since an N-bit MISR shifts, comparing a single bit of the MISR each cycle guarantees detection within N cycles of a problem. The method of U.S. Pat. No. 5,784,383 for identifying errors includes accumulating bus signature information which is a function of current and previous values of an input bus structures to determine sync of buses.

Functional testing for verification of functional design of processors is partly done by comparing the actual to expected values of architected registers after simulation of test instruction streams consisting of a few to many instructions. This type of functional verification may be incomplete for cases where an instruction in a test instruction stream updates a register incorrectly due to a functional design problem, but the problem is not detected because the incorrect register value is overwritten by a subsequent instruction in the test instruction stream before being used as a source operand. The comparison of actual to expected results at the completion of the simulation of the entire test instruction stream does not detect this functional error since the incorrect interim register value is not observed and does not affect the final register value. Improvement of the functional verification of processors by having all interim register values of test instruction streams checked, while only comparing actual to expected values at the completion of the simulation of the test instruction stream, is described in U.S. Pat. No. 6,311,311 (Swaney et al.), which is herein incorporated by reference in its entirety.

SUMMARY

Embodiments include a method and computer program product for matrix and compression-based error detection. An aspect includes summing, by each of a first plurality of summing modules of a first compressor, a respective row of a matrix, the matrix comprising a plurality of rows and a plurality of columns of output bits of a circuit under test wherein each output bit of the circuit under test comprises an element of the matrix, and is a member of a row of a column that is orthogonal to the row, each of the first plurality of summing modules being coupled to the respective row of the matrix. Another aspect includes summing, by each of a second plurality of summing modules of a second compressor, a respective column of output bits of the matrix, each of the second plurality of summing modules being coupled to the respective column of the matrix. Yet another aspect includes determining a presence of an error in the circuit under test based at least one of an output of the first compressor and an output of the second compressor.

BRIEF DESCRIPTION OF THE SEVERAL VIEWS OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

DETAILED DESCRIPTION

Embodiments of matrix and compression-based error detection are provided, with exemplary embodiments being discussed below in detail. Errors in a circuit under test (CUT) may be detected using a matrix of CUT output bits and one or more compressors in conjunction with one or more MISRs in some embodiments. Two orthogonal MISRs may be used in conjunction with a matrix of CUT output bits and compressors in some embodiments. In other embodiments, a single MISR may be used. The MISR(s) outputs a signature that is monitored to determine the presence of errors in the CUT. The size of the logic required for error checking may be thereby reduced, and multi-bit errors (up to 3-bit errors in some embodiments) may be detected with 100% accuracy relatively quickly. In further embodiments, a bit matrix and compressors may be used in conjunction with a parity checking system, and the MISR(s) may be omitted.

The size of the matrix and MISR(s) in embodiments of an error detection system is determined based on the number of output bits of the CUT. For example, embodiments of a CUT having a number of output bits from 37 to 49 require a 7×7, or 49-bit, output bit matrix, and embodiments of a CUT having a number of output bits from 50 to 64 require an 8×8, or 64-bit, output bit matrix. The number of bits required per MISR in a dual, orthogonal MISR embodiment is the square root of the number of output bits of the CUT in the matrix. Each MISR corresponds to a respective compressor; the compressors sum the CUT output bits along each of the rows and columns of the matrix of CUT output bits. In other embodiments, the compressors may be used in conjunction with a single MISR having a number of bits equal to two times the square root of the number of CUT output bits.

Figure 1A:
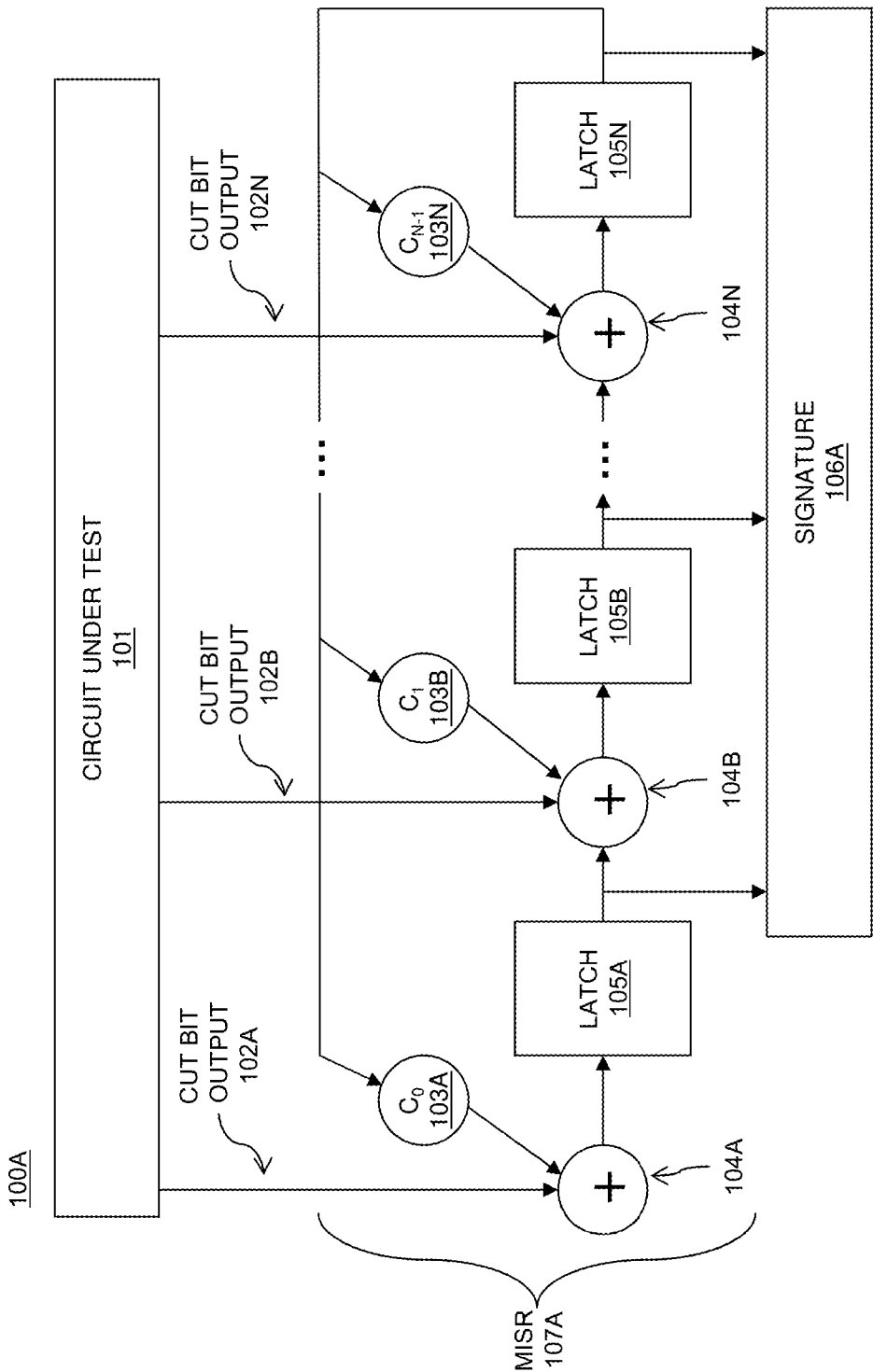
FIGS. 1A-B depict MISRs in accordance with embodiments.
Figure 1B:
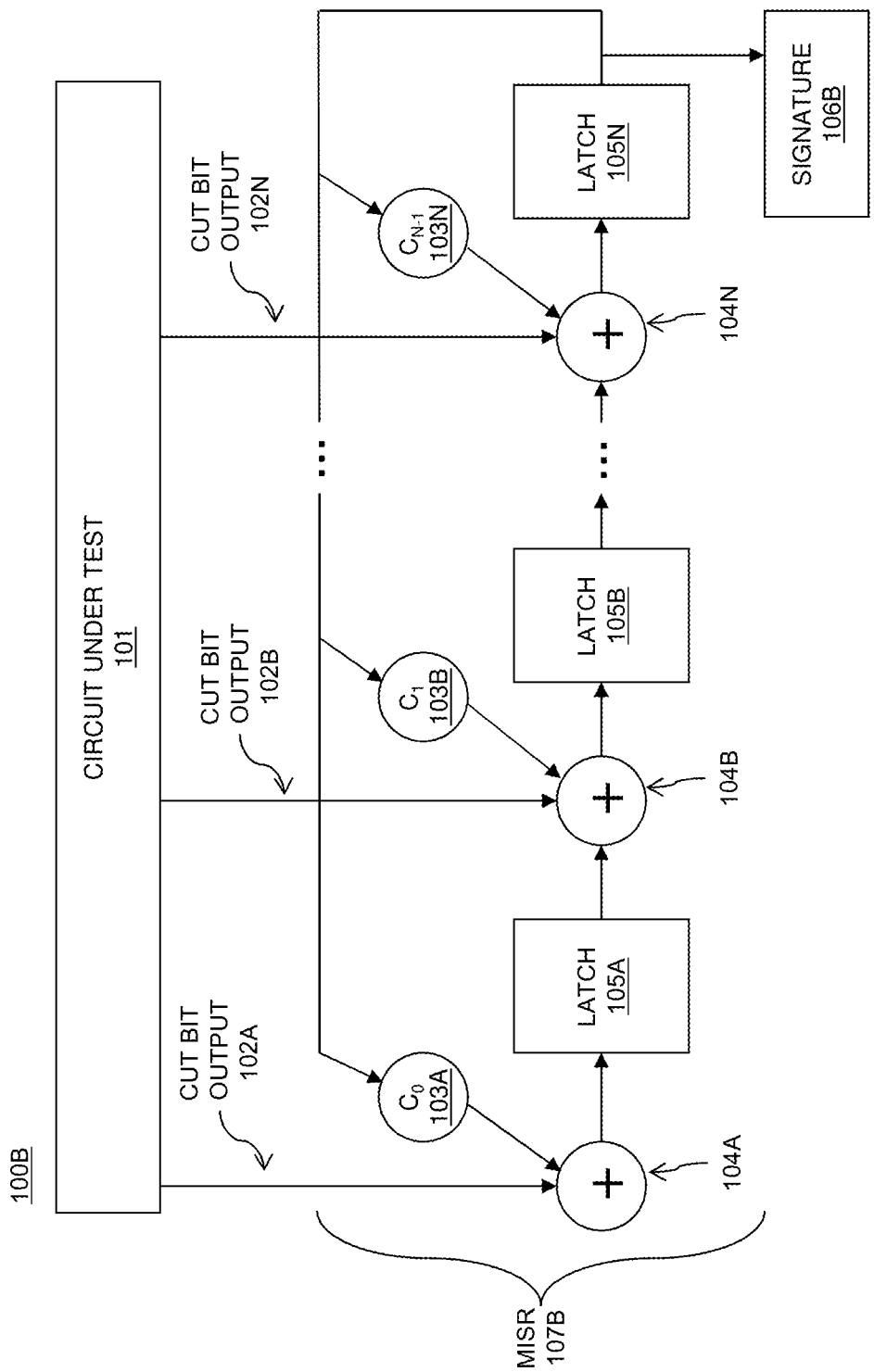

Turning now to FIGS. 1A-B, embodiments of MISR systems 100A-B are generally shown. In FIG. 1A, CUT 101 outputs a plurality of CUT output bits 102A-N to a MISR 107A. Each of CUT output bits 102A-N corresponds to a respective polynomial generator 103A-N of a finite field, which may be in $GF(2^n)$, adder 104A-N, which may be an exclusive OR (XOR) in a finite field $GF(2^n)$, and latch 105A-N. The N-bit MISR 107A of FIG. 1A outputs a signature 106A having N bits, corresponding to the number of CUT output bits 102A-N. This signature is monitored to determine errors in the CUT 101. In FIG. 1B, the N-bit MISR 107B generates a 1-bit signature 106B, which is monitored to determine errors in the CUT 101. An N-bit signature such as signature 106A may result in faster error detection by the MISR 107A, while a 1-bit signature such as signature 106B may require smaller, less complicated hardware in MISR 107B.

Figure 2:
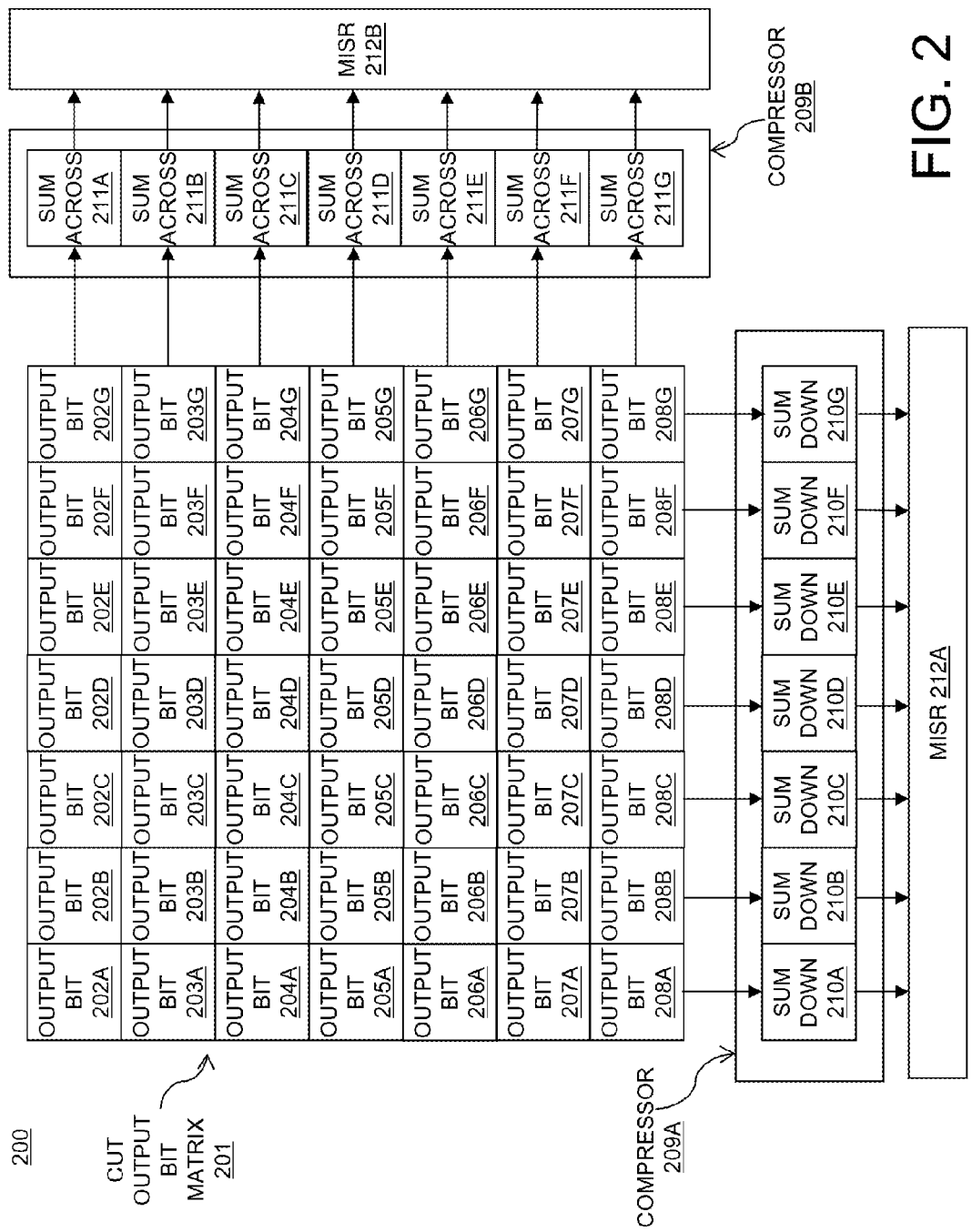
FIG. 2 depicts a circuit under test (CUT) output bit matrix with a compressor and orthogonal MISRs in accordance with an embodiment.

FIG. 2 illustrates an embodiment of a matrix and compression-based error detection system 200 including two orthogonal MISRs 212A-B. The system 200 includes a 49-bit CUT output bit matrix 201 (e.g., a 7×7 matrix), and may be used in conjunction with a CUT having up to 49 output bits. Each output bit of the CUT that is monitored by system 200 corresponds to one of output bits 202A-G, 203A-G, 204A-G, 205A-G, 206 A-G, 207A-G, and 208A-G. Error detection is performed using compressors 209A-B and orthogonal MISRs 212A-B. Compressor 209A includes a plurality of sum down modules 210A-G, each of which takes a sum of a respective column of the CUT output bit matrix 201. For example, sum down module 210A takes a sum of CUT bit outputs 202A, 203A, 204A, 205A, 206A, 207A, and 208A. The outputs of each of the sum down modules 210A-G (which may correspond to output bits 102A-N of FIG. 1) are provided to a respective bit of 7-bit MISR 212A. Compressor 209B includes a plurality of sum across modules 211A-G, each of which takes a sum of a respective row of the CUT output bit matrix 201. For example, sum across module 211A takes a sum of CUT bit outputs 202A-G. The outputs of each of the sum across modules 211A-G (which may correspond to output bits 102A-N of FIG. 1) are provided to a respective bit of 7-bit MISR 212B. MISRs 212A-B may each comprise a MISR such as either of MISRs 107A or 107B of FIGS. 1A-B. FIG. 2 is shown for illustrative purposes only; a CUT output bit matrix may comprise any N×N matrix of CUT output bits, and the corresponding compressors may have N sum down and sum across modules that are associated with respective N-bit MISRs. Further, a CUT that is used in conjunction with a system such as system 200 may have a number of output bits that is less than or equal to $N^2$. In embodiments in which the CUT has less than $N^2$ output bits, one or more output bits in the CUT output bit matrix may be null.

Error detection in system 200 is 100% for up to 3-bit errors, and may be performed as follows. For an example 1-bit error located in output bit 202A, each of sum down module 210A and sum across module 211A will give an erroneous output, which will be detected based on the signatures of both MISRs 212A-B. For an example 2-bit error, with errors in output bit 202A and output bit 202B, sum across module 211A will not indicate the errors, as the bit outputs 202A-B cancel each other out in the row that corresponds to sum across module 211A. However, sum down module 210A will indicate the error in output bit 202A, and sum down module 210B will indicate the error in output bit 202B, to MISR 212A. For an example 3-bit error, with errors in output bit 202A, output bit 202B, and output bit 203B, sum down module 210B and sum across module 211A will not indicate any error, as the errors in output bits 202B and 203B cancel each other out in the column corresponding to sum across module 210B, and the errors in output bits 202A and 202B cancel each other out in the row corresponding to sum across module 211A. However, the error in output bit 202A will be indicated by sum down module 210A, and the error in output bit 203B will be indicated by sum across module 211B. While some 4-bit errors may be detected by system 200, it is possible for a 4-bit error to be undetected (for example, if the errors are located in each of bit outputs 202A-B and 203A-B, the errors will cancel each other out in both the row and column directions). While the presence of bit errors up to 3-bit errors may be detected accurately, the bit errors may not be corrected using system 200, as the number and location of the bits in error may not be determined accurately.

Figure 3:
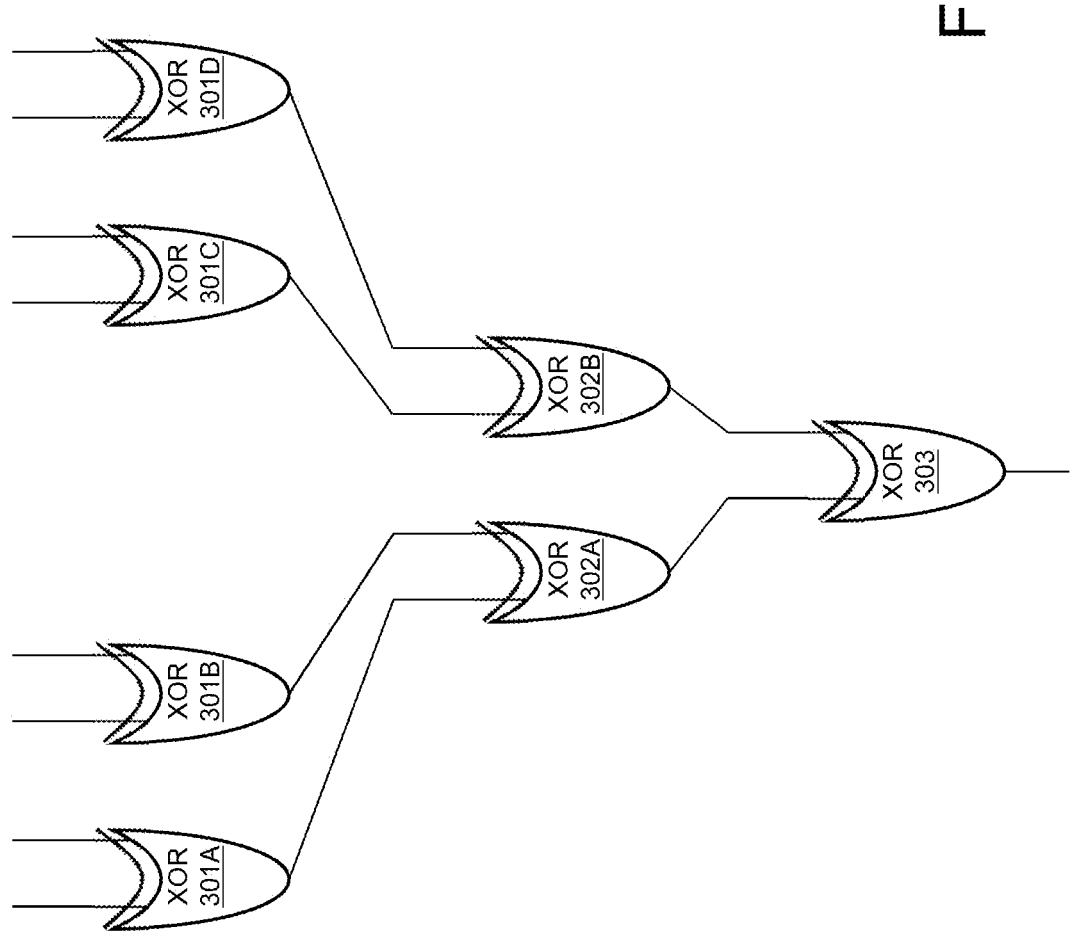
FIG. 3 depicts a summing module for a compressor in accordance with and embodiment.

FIG. 3 illustrates an embodiment of a summing module 300. Summing module 300 may comprise any of sum down modules 210A-G and sum across modules 211 A-G that were shown in FIG. 2. The summing module 300 comprises a plurality of XOR modules 301A-D, 302A-B, and 303 that are arranged in levels to perform addition in a finite field $GF(2^n)$, and may accept up to 8 inputs in input XOR modules 301A-D. If summing module 300 receives less than 8 inputs from an output bit matrix, one or more of the inputs to input XOR modules 301A-D may be inactive; an input XOR module having a single active input passes the single input through. A single sum output is output by output XOR module 303, which is provided to the MISR associated with the compressor in which the summing module 300 is located. FIG. 3 is shown for illustrative purposes only; in embodiments in which a summing module having more than 8 inputs is required, additional XOR modules may be added to expand the XOR tree structure.

Figure 4:
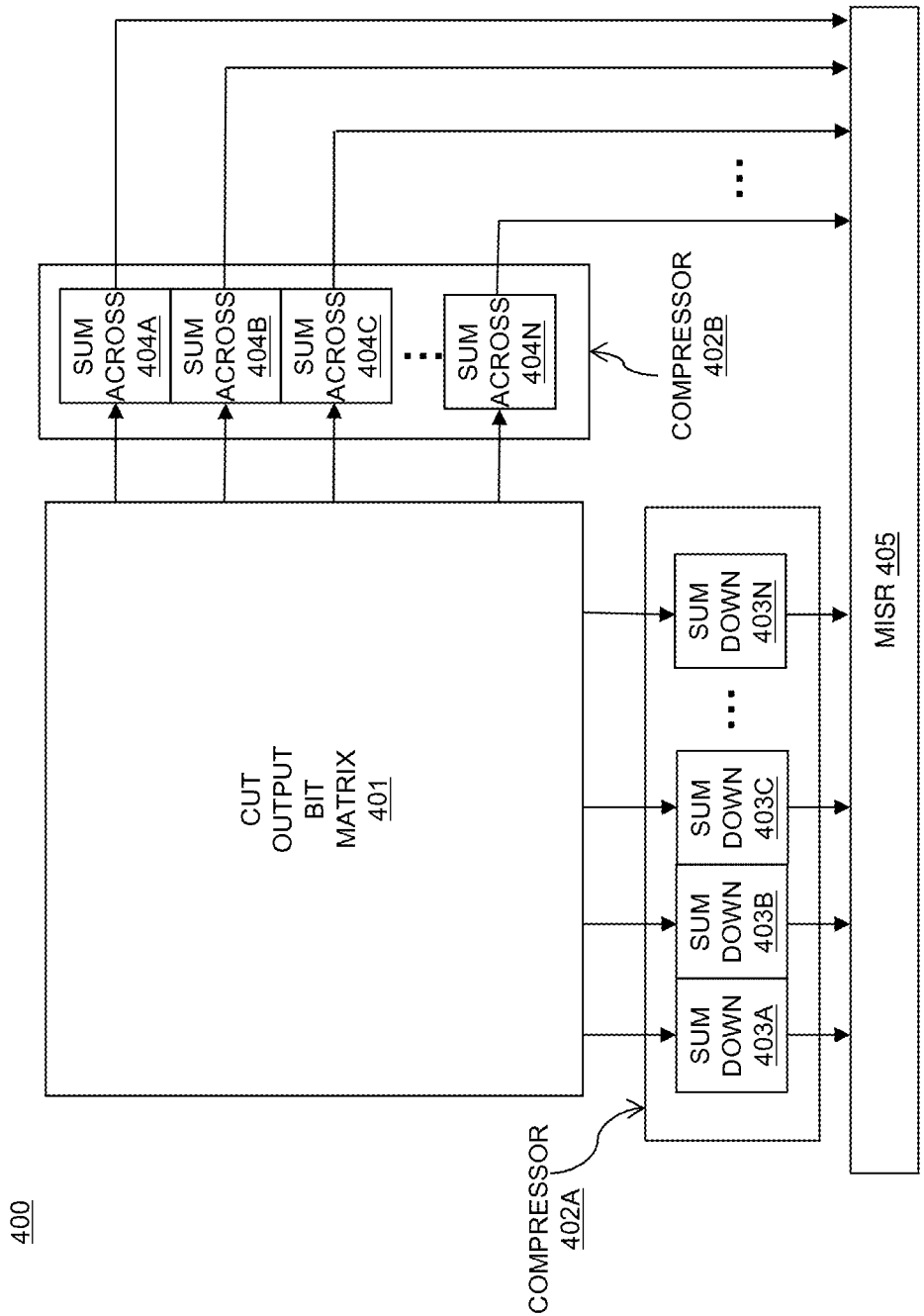
FIG. 4 depicts a CUT output bit matrix with a compressor and a single MISR in accordance with an embodiment.

FIG. 4 illustrates an embodiment of a matrix and compression-based error detection system 400 including a single MISR 405. The system 400 includes a N×N bit CUT output bit matrix 401, and may be used in conjunction with a CUT having up to $N^2$ output bits. Each output bit of the CUT that is used in conjunction with system 400 corresponds to a single entry in the CUT output bit matrix 401. Error detection is performed using compressors 402A-B and MISR 405, which comprises a 2N-bit MISR. Compressor 402A includes a plurality of sum down modules 403A-N, each of which takes a sum of a respective column of N entries of the CUT output bit matrix 201. The outputs of each of the sum down modules 403A-N (which may correspond to output bits 102A-N of FIG. 1A-B) are provided to MISR 405. Compressor 402B includes a plurality of sum across modules 404A-N, each of which takes a sum of a respective row of N entries of the CUT output bit matrix 201. The outputs of each of the sum across modules 404A-N (which may correspond to output bits 102A-N of FIG. 1A-B) are also provided to MISR 405. Each of sum down modules 403A-N and sum across modules 404A-N may comprise a summing module 300 as was shown in FIG. 3. MISR 405 may comprise a MISR such as either of MISRs 107A or 107B of FIGS. 1A-B. FIG. 2 is shown for illustrative purposes only; a CUT output bit matrix may comprise any N×N matrix of CUT output bits, and the corresponding compressors may have N sum down or across modules that are used in conjunction with a single 2N-bit MISR. Further, a CUT that is used in conjunction with a system such as system 200 may have a number of output bits that is less than or equal to $N^2$. In embodiments in which the CUT has less than $N^2$ output bits, one or more output bits in the output bit matrix may be null.

Figure 5:
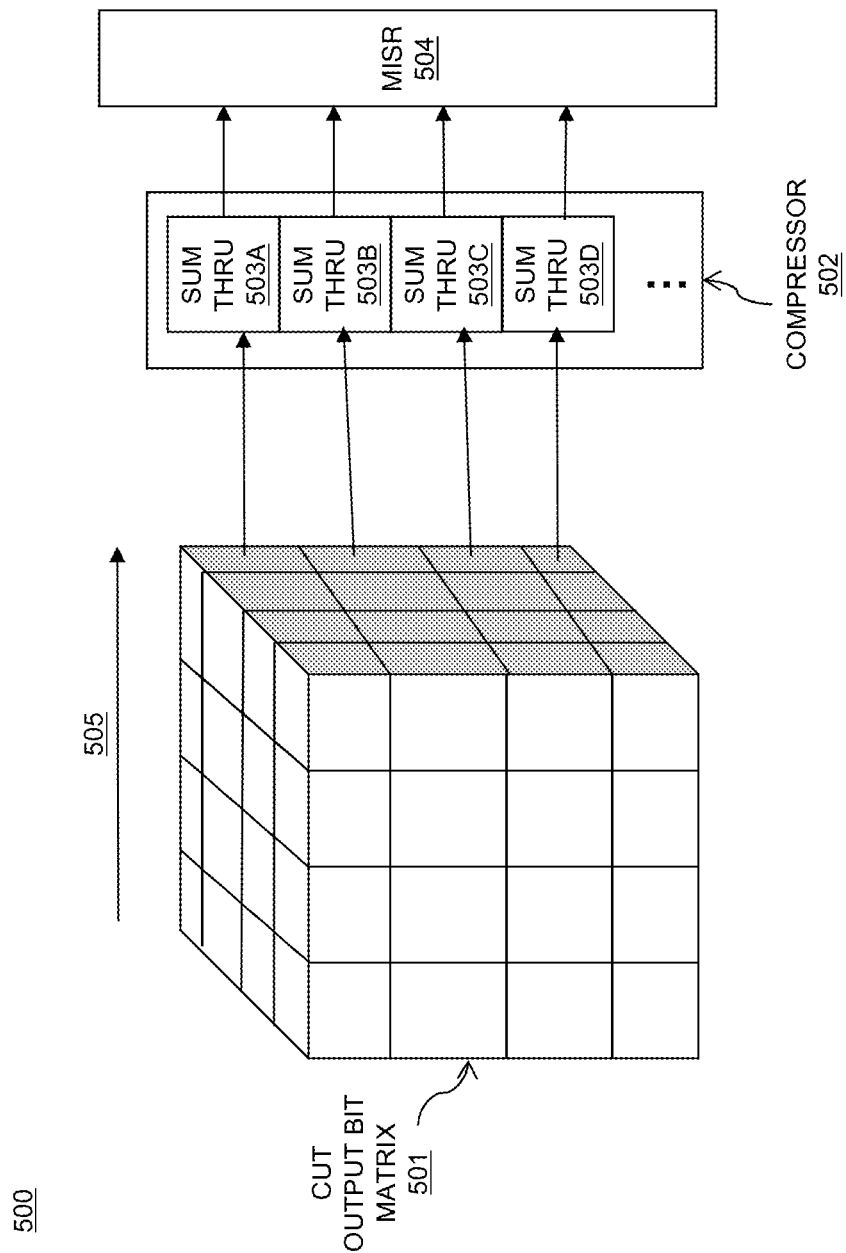
FIG. 5 depicts a 3-dimensional CUT output bit matrix with a compressor and a MISR in accordance with an embodiment.

FIG. 5 illustrates an embodiment of a matrix and compression-based error detection system 500 including a N×N×N 3-dimensional CUT output bit matrix 501. In system 500, each of the directions (i.e., x, y, and z axis) through the 3-dimensional CUT output bit matrix 501 has a respective compressor, such as compressor 502, comprising a plurality sum through modules such as sum through modules 503A-D. A compressor for a single direction through the cube has a number of sum-through modules equal to $N^2$, and each of the sum through modules takes a sum of N entries in a row of the 3-dimensional CUT output bit matrix 501. For example, sum through module 503A takes the sum of 4 entries along the edge of the 3-dimensional CUT output bit matrix 501 in the direction indicated by arrow 505. The compressor 502 is associated with a $N^2$-bit MISR 504. 3-dimensional CUT output bit matrix 501 as shown in FIG. 5 is a 4×4×4 matrix (i.e., N=4); therefore system 500 comprises 3 separate compressors 502, each including 16 sum through modules that each take a sum of 4 entries through the 3-dimensional CUT output bit matrix 501. Each compressor is further associated with a respective 16-bit MISR 504, which may comprise any of MISRs 107A-B shown in FIGS. 1A-B. However, FIG. 5 is shown for illustrative purposes only; N may have any appropriate value in various embodiments of a system such as system 500. A matrix and compression-based error detection system comprising a 3-dimensional CUT output bit matrix may detect bit errors up to 7 bits (i.e., $2^j-1$, where j is the number of dimensions of the CUT output bit matrix) with 100% accuracy.

Figure 6:
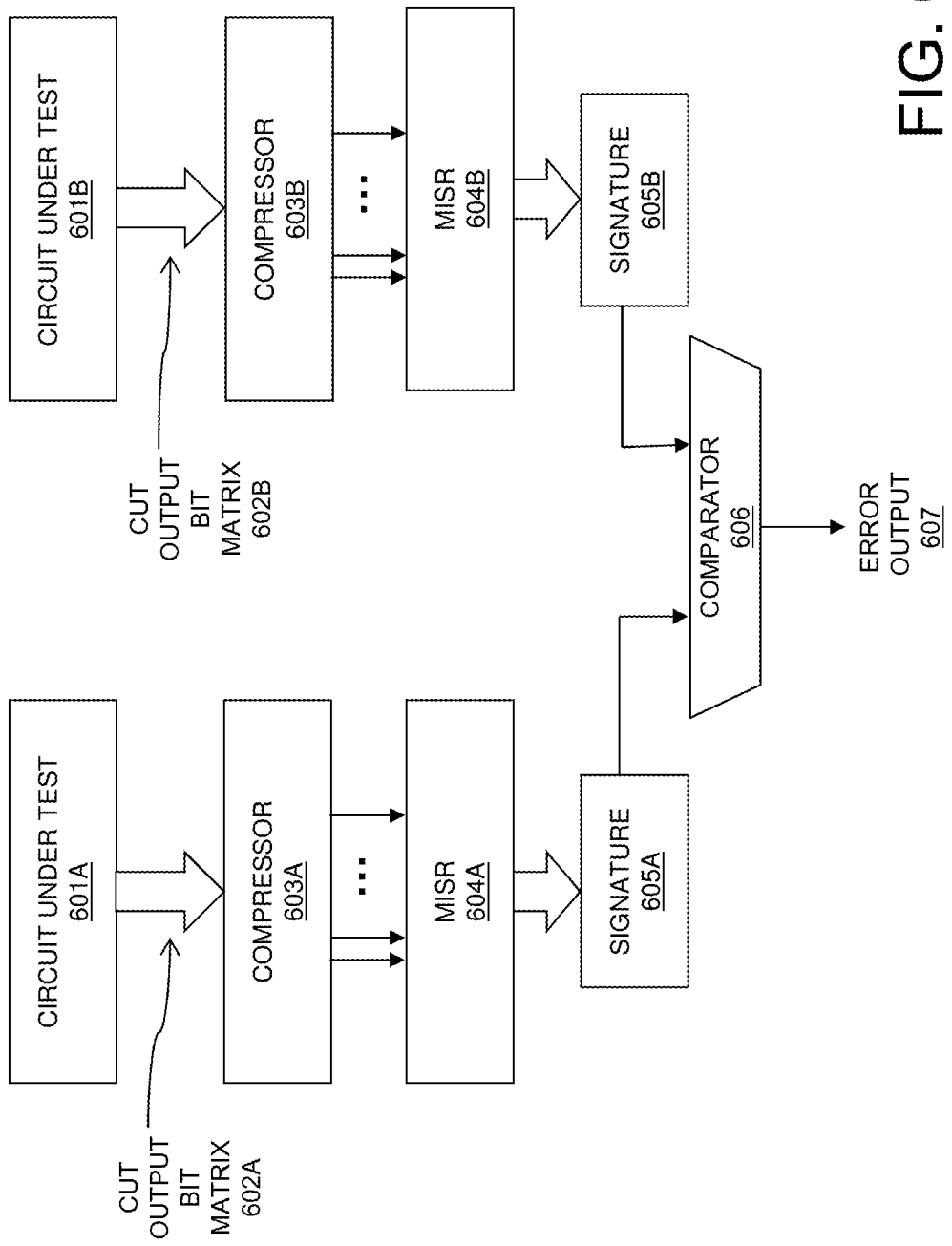
FIG. 6 depicts an error detection system in accordance with an embodiment.

FIG. 6 illustrates an embodiment of a system 600 for matrix and compression based error detection. System 600 includes two circuits under test 601A-B, which may comprise copies of the same logic within a computing system that are configured to have outputs that track one another. Each of the circuits under test 601A-B outputs separate CUT output bits 602A-B that are arranged in a matrix format, which may be configured as shown with respect to any of FIG. 2, 4, or 5. These output bit matrices are processed by summing modules in compressors 603A-B. Compressors 603A-B may comprise any of compressors 209A-B, 402A-B, or 502 of FIGS. 2, 4, and 5. Each of compressors 603A-B shown in FIG. 6 comprises a compressor that processes the same direction in the compressor's respective output bit matrix, i.e., compressors 603A-B may each comprise a plurality of sum across modules, or may each comprise a plurality of sum down modules. For instance, if compressor 603A comprises compressor 209B in FIG. 2, and sums across the rows of a first output bit matrix that is output by CUT 601A, then compressor 603B comprises a plurality of sum-across modules that sum across the rows of a separate output bit matrix that is output by CUT 601B. The outputs of compressors 603A-B are received by respective MISRs 604A-B. MISRs 604A-B may comprise any of MISRs 212A-B, 405, or 504 of FIGS. 2, 4, and 5. Each of MISRs 604A-B outputs a signature 605A-B (such as signatures 106A-B of FIGS. 1A-B) to comparator 606, and the signatures 605A-B are compared by comparator 606. Any mismatches between the signatures 605A-B results in an error being indicated at error output 607.

Figure 7:
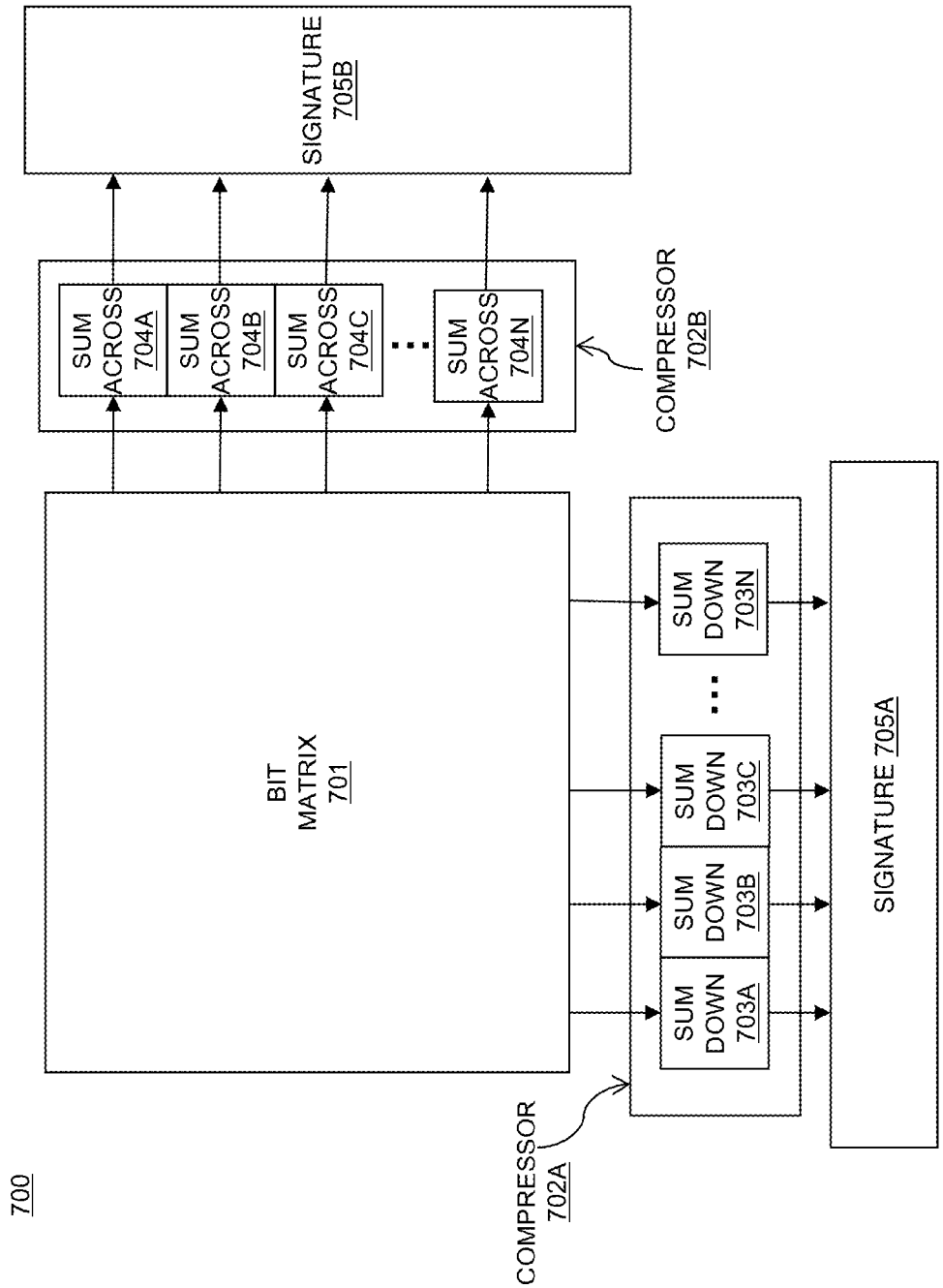
FIG. 7 depicts a multi-dimensional parity compressor in accordance with an embodiment.

FIG. 7 depicts an embodiment of a multi-dimensional parity system 700 including a bit matrix and compressor in accordance with an embodiment. System 700 includes an N×N bit matrix 701 comprising bits that are being checked for errors using a parity matrix encoding scheme. Error detection is performed using compressors 702A-B and signatures 705A-B. Compressor 702A includes a plurality of sum down modules 703A-N, each of which takes a sum of a respective column of N entries of the bit matrix 701. The outputs of each of the sum down modules 703A-N are provided to signature module 705A. Compressor 702B includes a plurality of sum across modules 704A-N, each of which takes a sum of a respective row of N entries of the bit matrix 201. The outputs of each of the sum across modules 704A-N are also provided to signature module 705B. Each of sum down modules 703A-N and sum across modules 704A-N may comprise a summing module 300 as was shown in FIG. 3. FIG. 7 is shown for illustrative purposes only; a bit matrix may comprise any N×N matrix of bits, and the corresponding compressors may have N sum down or across modules.

Figure 8:
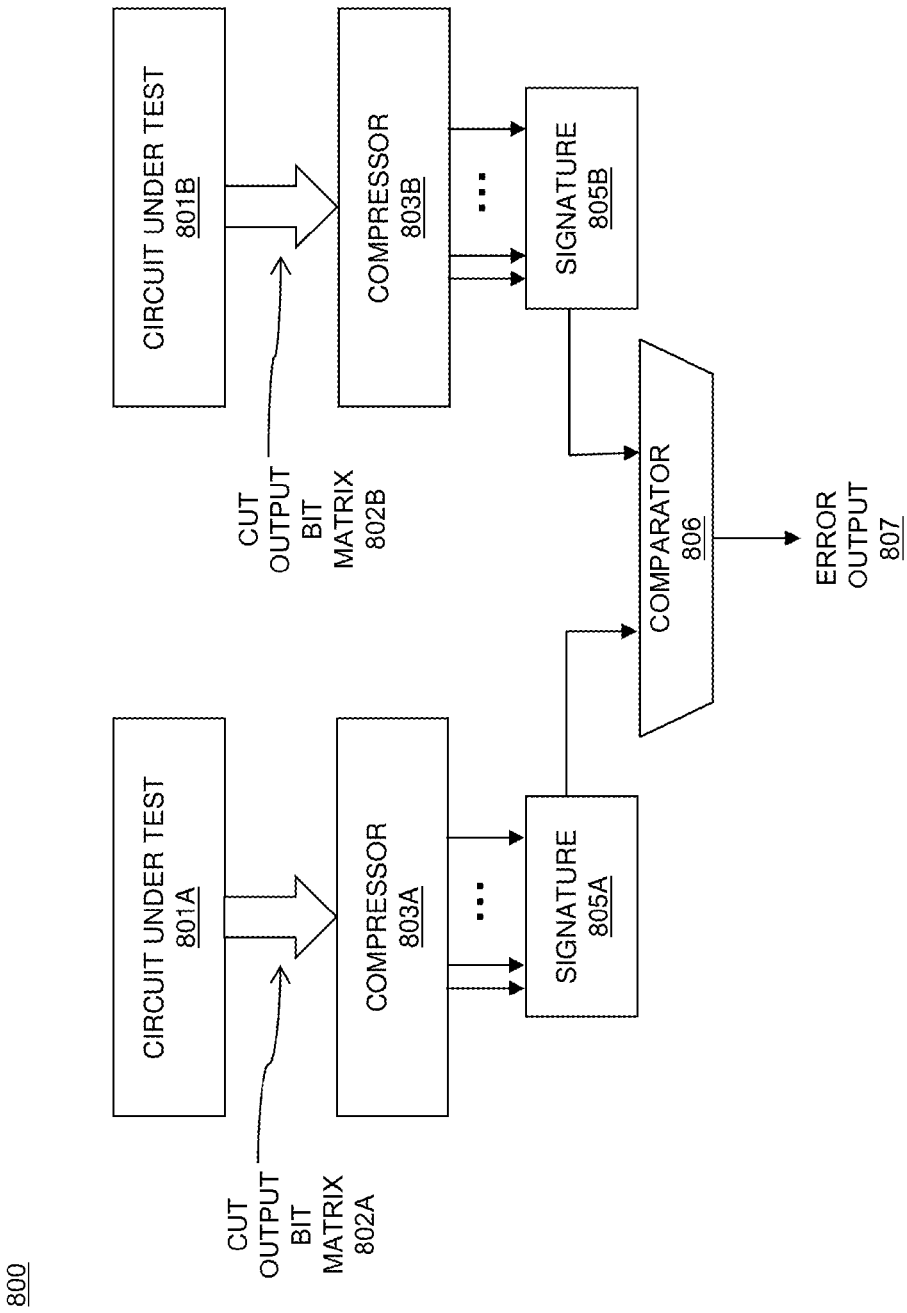
FIG. 8 depicts an error detection system in accordance with an embodiment.

FIG. 8 illustrates an embodiment of a system 800 for matrix and compression based error detection. System 800 includes two circuits under test 801A-B, which may comprise copies of the same logic within a computing system that are configured to have outputs that track one another. Each of the circuits under test 801A-B outputs separate CUT output bits 802A-B that are arranged in a matrix format, which may be configured as shown with respect to FIG. 7. These output bit matrices are processed by summing modules in compressors 803A-B. Compressors 803A-B may comprise either of compressors 702A-B of FIG. 7. Each of compressors 803A-B shown in FIG. 8 comprises a compressor that processes the same direction in the compressor's respective output bit matrix, i.e., compressors 803A-B may each comprise a plurality of sum across modules, or may each comprise a plurality of sum down modules. For instance, if compressor 803A comprises compressor 702B in FIG. 7, and sums across the rows of a first output bit matrix that is output by CUT 801A, then compressor 803B comprises a plurality of sum-across modules that sum across the rows of a separate output bit matrix that is output by CUT 801B. the outputs of compressors 803A-B are received by respective signature 805A-B (such as signatures 705A-B of FIG. 7) to comparator 806, and the signatures 805A-B are compared by comparator 806. Any mismatches between the signatures 805A-B results in an error being indicated at error output 807.

Figure 9:
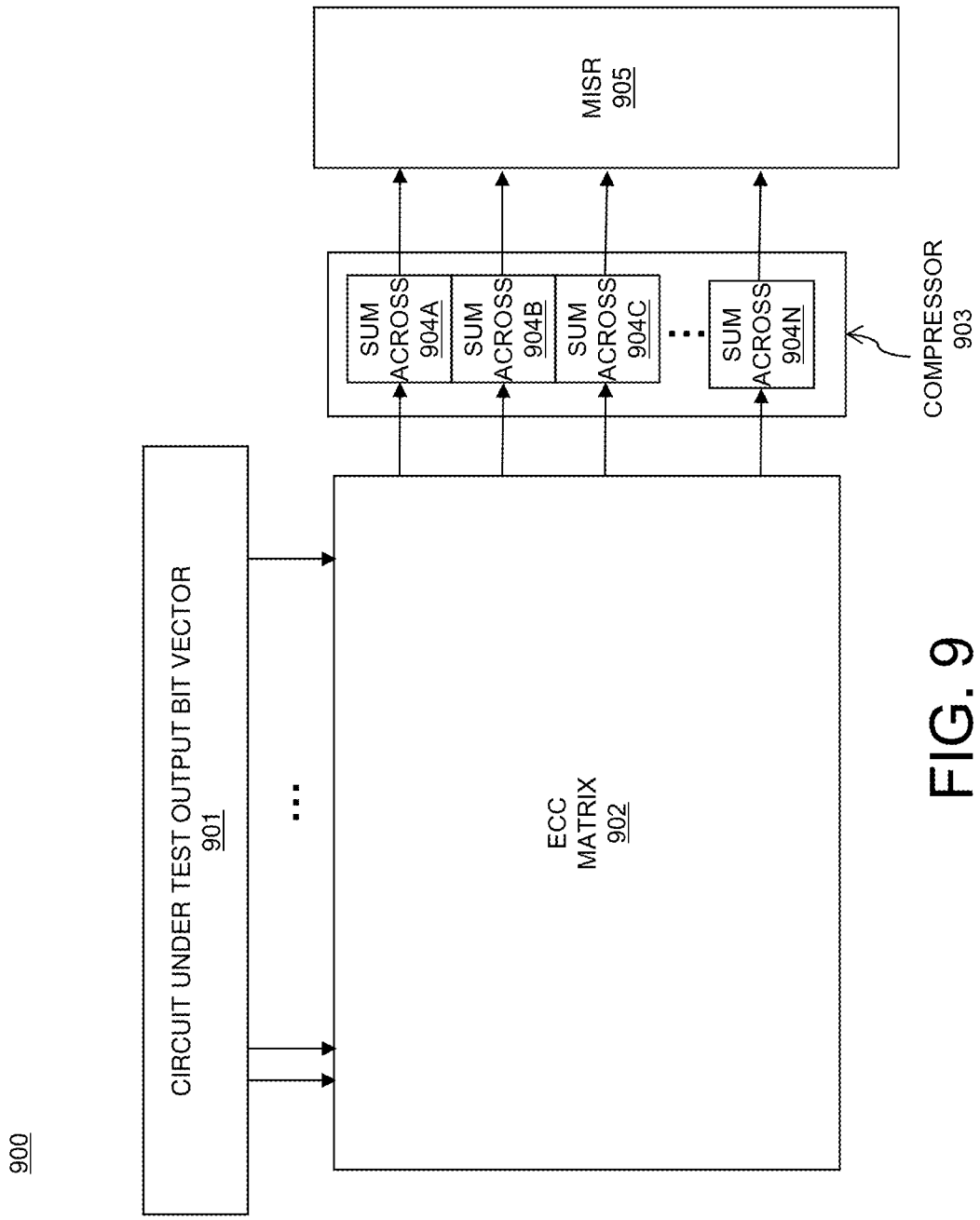
FIG. 9 depicts an error detection system including an ECC matrix and compressor in accordance with an embodiment.

FIG. 9 depicts and embodiment of a system 900 including ECC compression in accordance with an embodiment. System 900 includes an ECC matrix 902 comprising an ECC code with multiple error detection properties, for example a Hamming code that includes a parity bit to provide double error detection, or another ECC code, for example a BCH (Bose, Chaudhuri, Hocquenghem) code, that provides multiple error detection. Error detection is performed using compressor 903 to sum the CUT output bit vector 901 through the ECC matric 902. Each row of ECC matrix 902 is applied as a mask to CUT output vector 901, indentifying which bits of output vector 901 to include in each sum that is output by sum across modules 904A-N. Sum across modules 904A-N may comprise summing modules 300 as shown in FIG. 3. The resulting vector that is output by sum across modules 904A-N in compressor 903 is supplied to MISR 905. An error detection system that is used in conjunction with system 900 includes two circuits under test with output vectors 901 (which may correspond to CUT bit output matrices 602A-B in FIG. 6), two compressors 903 (which may correspond to compressors 603A-B of FIG. 6), two MISRs 905, (which may correspond to MISRs 604A-B of FIG. 6) and further include two signatures 605A-B, a comparator 606, and an error output 607 as shown in FIG. 6. The use of the compressor 903 in conjunction with ECC matrix 902 will result in mismatching signatures 605A-B for a number of errors in CUT output bit vectors 901 up to the error detection capabilities of the selected ECC matrix 902.

Figure 10:
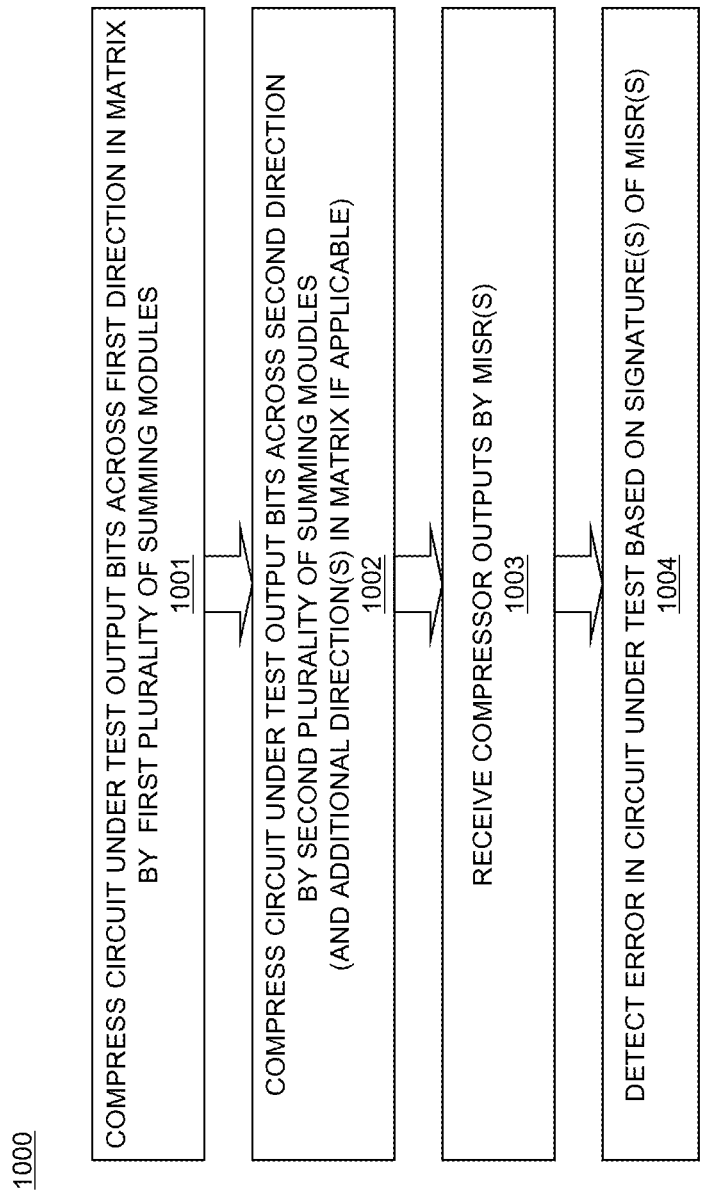
FIG. 10 depicts a process flow for matrix and compression-based error detection in accordance with an embodiment.

FIG. 10 depicts an embodiment of a method 1000 for matrix and compression-Obased error detection. First, in block 1001, the entries in a bit matrix, which may comprise a CUT output bit matrix such as CUT output bit matrices 201, 401, or 501, a bit matrix such as bit matrix 701, or an ECC matrix as in 902 that identifies which of the bits of CUT output bit vector 901 are to be included in each bit of the sum 903, are summed by summing modules in a compressor in a first direction. In block 1002, the entries in the bit matrix are summed by summing modules in another compressor in a second, or additional direction. In block 1003, the compressor outputs are received by one or more MISRs, and, in block 1004, the MISR signature(s) is monitored and compared with an equivalent MISR signature from another instance of the CUT (for example, as shown in FIGS. 6 and 8) to determine any errors in the CUT.

Figure 11:
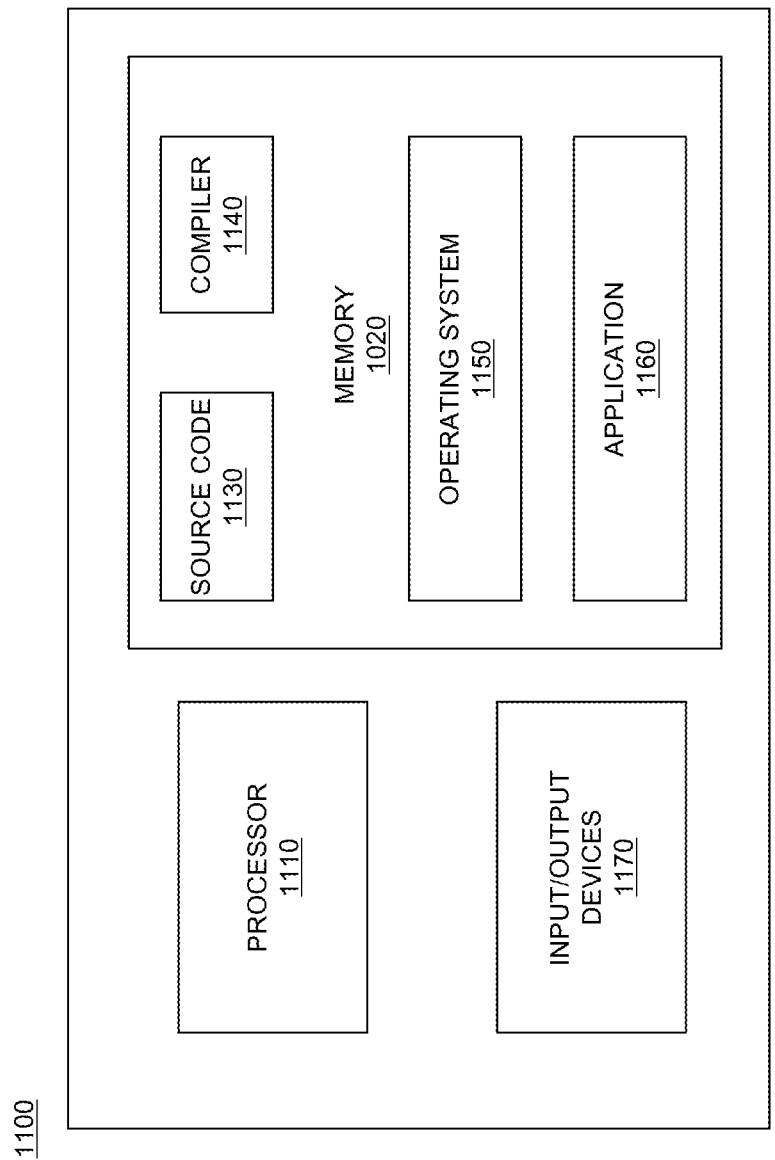
FIG. 11 illustrates a computer system in accordance with an embodiment.

Again with reference to FIG. 10, in an embodiment, method 1000 is implemented by a circuit under test that outputs a plurality of output bits to a matrix comprising a plurality of rows and columns and a first compressor comprising a first plurality of summing modules. In block 1001, each of the first plurality of summing modules summing respective row of output bits in the matrix. In block 1002, the entries in the bit matrix are summed by summing modules in another compressor in a second, or additional direction. In block 1003, the compressor outputs are received by one or more MISRs, and, in block 1004, it is determined, based on at least the first plurality of summing modules in the first compressor, the presence of an error in the circuit under test FIG. 11 illustrates an example of a computer 1100 which may be utilized in conjunction with exemplary embodiments of matrix and compression-based error detection. Various operations discussed above may utilize the capabilities of the computer 1100. One or more of the capabilities of the computer 1100 may incorporate any element, module, application, and/or component discussed herein.

The computer 1100 includes, but is not limited to, PCs, workstations, laptops, PDAs, palm devices, servers, storages, and the like. Generally, in terms of hardware architecture, the computer 1100 may include one or more processors 1110, memory 1120, and one or more I/O devices 1170 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 1110 is a hardware device for executing software that can be stored in the memory 1120. The processor 1110 can be virtually any custom made or commercially available processor, a central processing unit (CPU), a digital signal processor (DSP), or an auxiliary processor among several processors associated with the computer 1100, and the processor 1110 may be a semiconductor based microprocessor (in the form of a microchip) or a macroprocessor.

The memory 1120 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 1120 may incorporate electronic, magnetic, optical, and/or other types of storage media. Note that the memory 1120 can have a distributed architecture, where various components are situated remote from one another, but can be accessed by the processor 1110.

The software in the memory 1120 may include one or more separate programs, each of which comprises an ordered listing of executable instructions for implementing logical functions. The software in the memory 1120 includes a suitable operating system (0/S) 1150, compiler 1140, source code 1130, and one or more applications 1160 in accordance with exemplary embodiments. As illustrated, the application 1160 comprises numerous functional components for implementing the features and operations of the exemplary embodiments. The application 1160 of the computer 1100 may represent various applications, computational units, logic, functional units, processes, operations, virtual entities, and/or modules in accordance with exemplary embodiments, but the application 1160 is not meant to be a limitation.

The operating system 1150 controls the execution of other computer programs, and provides scheduling, input-output control, file and data management, memory management, and communication control and related services. It is contemplated by the inventors that the application 1160 for implementing exemplary embodiments may be applicable on all commercially available operating systems.

Application 1160 may be a source program, executable program (object code), script, or any other entity comprising a set of instructions to be performed. When a source program, then the program is usually translated via a compiler (such as the compiler 1140), assembler, interpreter, or the like, which may or may not be included within the memory 1120, so as to operate properly in connection with the O/S 1150. Furthermore, the application 1160 can be written as an object oriented programming language, which has classes of data and methods, or a procedure programming language, which has routines, subroutines, and/or functions, for example but not limited to, C, C++, C#, Pascal, BASIC, API calls, HTML, XHTML, XML, ASP scripts, FORTRAN, COBOL, Perl, Java, ADA, .NET, and the like.

The I/O devices 1170 may include input devices such as, for example but not limited to, a mouse, keyboard, scanner, microphone, camera, etc. Furthermore, the I/O devices 1170 may also include output devices, for example but not limited to a printer, display, etc. Finally, the I/O devices 1170 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 1170 also include components for communicating over various networks, such as the Internet or intranet.

If the computer 1100 is a PC, workstation, intelligent device or the like, the software in the memory 1120 may further include a basic input output system (BIOS) (omitted for simplicity). The BIOS is a set of essential software routines that initialize and test hardware at startup, start the O/S 1150, and support the transfer of data among the hardware devices. The BIOS is stored in some type of read-only-memory, such as ROM, PROM, EPROM, EEPROM or the like, so that the BIOS can be executed when the computer 1100 is activated.

When the computer 1100 is in operation, the processor 1110 is configured to execute software stored within the memory 1120, to communicate data to and from the memory 1120, and to generally control operations of the computer 1100 pursuant to the software. The application 1160 and the O/S 1150 are read, in whole or in part, by the processor 1110, perhaps buffered within the processor 1110, and then executed.

When the application 1160 is implemented in software it should be noted that the application 1160 can be stored on virtually any computer readable storage medium for use by or in connection with any computer related system or method. In the context of this document, a computer readable storage medium may be an electronic, magnetic, optical, or other physical device or means that can contain or store a computer program for use by or in connection with a computer related system or method.

The application 1160 can be embodied in any computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable storage medium" can be any means that can store the program for use by or in connection with the instruction execution system, apparatus, or device. The computer readable storage medium can be, for example but not limited to, an electronic, magnetic, optical, electromagnetic, or semiconductor system, apparatus, or a device.

More specific examples (a nonexhaustive list) of the computer-readable storage medium may include the following: an electrical connection (electronic) having one or more wires, a portable computer diskette (magnetic or optical), a random access memory (RAM) (electronic), a read-only memory (ROM) (electronic), an erasable programmable read-only memory (EPROM, EEPROM, or Flash memory) (electronic), an optical fiber (optical), and a portable compact disc memory (CDROM, CD R/W) (optical). Note that the computer-readable storage medium could even be paper or another suitable medium, upon which the program is printed or punched, as the program can be electronically captured, via for instance optical scanning of the paper or other medium, then compiled, interpreted or otherwise processed in a suitable manner if necessary, and then stored in a computer memory.

In exemplary embodiments, where the application 1160 is implemented in hardware, the application 1160 can be implemented with any one or a combination of the following technologies, which are well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Technical effects and benefits include relatively fast and accurate error detection using hardware having relatively reduced size and complexity.

Figure 12:
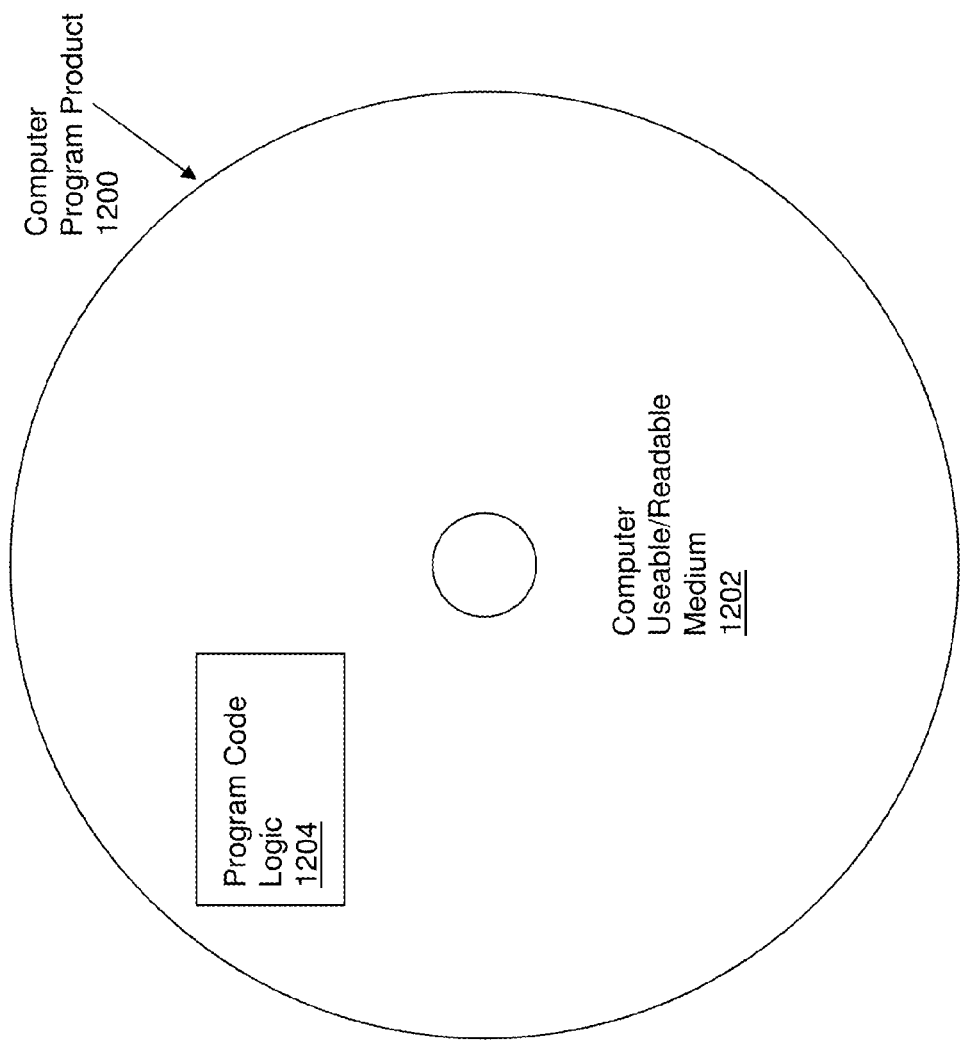
FIG. 12 illustrates a computer program product in accordance with an embodiment.

Referring to FIG. 12, one or more aspects of embodiments can be included in an article of manufacture (e.g., one or more computer program products 1200) having, for instance, computer readable storage media 1202. The media has embodied therein, for instance, computer readable program code (instructions) 1204 to provide and facilitate the capabilities of embodiments. The article of manufacture can be included as a part of a computer system or as a separate product.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A nonexhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer implemented method for matrix and compression-based error detection, the method comprising:
    summing, by each of a first plurality of summing modules of a first compressor, a respective row of a matrix, the matrix comprising a plurality of rows and a plurality of columns of output bits of a circuit under test wherein each output bit of the circuit under test comprises an element of the matrix, and is a member of a row of a column that is orthogonal to the row, each of the first plurality of summing modules being coupled to the respective row of the matrix; and
    summing, by each of a second plurality of summing modules of a second compressor, a respective column of output bits of the matrix, each of the second plurality of summing modules being coupled to the respective column of the matrix; and
    determining a presence of an error in the circuit under test based at least one of an output of the first compressor and an output of the second compressor.

2. The method of claim 1, wherein the matrix comprises M rows and N columns; wherein a number of the first plurality of summing modules is equal to M; and wherein a number of the second plurality of summing modules is equal to N.

3. The method of claim 2, wherein determining the presence of the error in the circuit under test based at least one of the output of the first compressor and the output of the second compressor comprises:
    providing outputs of the first plurality of M summing modules of the first compressor to a M-bit first multiple input signature register (MISR);
    outputting a first signature by the first MISR based on the outputs of the first plurality of summing modules;
    providing outputs of the second plurality of N summing modules of the second compressor to a N-bit second MISR;
    outputting a second signature by the second MISR based on the outputs of the second plurality of summing modules; and
    determining the presence of the error in the circuit under test based on at least one of the first signature and the second signature.

4. The method of claim 3, further comprising a second circuit under test comprising a copy of the circuit under test, the second circuit under test having an associated second plurality of output bits that are summed by a third compressor, and summed by a fourth compressor, wherein the output of the third compressor is provided to a third MISR, and the output of the fourth compressor is provided to a fourth MISR, and the method further comprising:
    comparing a signature of the third MISR to the signature of the first MISR, and determining the presence of the error in the circuit under test based on detecting a difference between the signature of the third MISR and the signature of the first MISR; and
    comparing a signature of the fourth MISR to the signature of the second MISR, and determining the presence of the error in the circuit under test based on detecting a difference between the signature of the fourth MISR and the signature of the second MISR.

5. The method of claim 2, wherein determining the presence of the error in the circuit under test based at least one of the output of the first compressor and the output of the second compressor comprises:

providing outputs of the first plurality of M summing modules of the first compressor to a (M+N)-bit first MISR;
providing outputs of the second plurality of N summing modules of the second compressor to the first MISR;
outputting a first signature by the first MISR based on the outputs of the first and second plurality of summing modules; and
determining the presence of the error in the circuit under test based on the first signature.

6. The method of claim 5, further comprising a second circuit under test comprising a copy of the circuit under test, the second circuit under test having an associated second plurality of output bits that are summed by a third compressor and a fourth compressor, and wherein the output of the third compressor and the output of the fourth compressor is provided to a second MISR, and the method further comprising:
comparing a signature of the second MISR to the signature of the first MISR, and determining the presence of the error in the circuit under test based on detecting a difference between the signature of the second MISR and the signature of the first MISR.

7. The method of claim 1, wherein the matrix comprises a 3-dimensional M×N×P arrangement of the output bits of the circuit under test; wherein a number of the first plurality of summing modules is equal to N×P, each of the first plurality of summing modules outputting a sum of M output bits through a dimension M of the matrix; wherein a number of the second plurality of summing modules is equal to M×P, each of the second plurality of summing modules outputting a sum of N output bits through a dimension N of the matrix; and further comprising a third compressor comprising a third plurality of summing modules, wherein a number of the third plurality of summing modules is equal to M×N, each of the third plurality of summing modules outputting a sum of P output bits through a dimension P of the matrix, and wherein the presence of the error in the circuit under test is determined based on at least one of the first, second, and third compressors.

8. A computer program product for implementing matrix and compression-based error detection, the computer program product comprising:
a non-transitory tangible storage medium readable by a processing circuit and storing instructions for execution by the processing circuit for performing a method comprising:
summing, by each of a first plurality of summing modules of a first compressor, a respective row of a matrix, the matrix comprising a plurality of rows and a plurality of columns of output bits of a circuit under test wherein each output bit of the circuit under test comprises an element of the matrix, and is a member of a row of a column that is orthogonal to the row, each of the first plurality of summing modules being coupled to the respective row of the matrix; and
summing, by each of a second plurality of summing modules of a second compressor, a respective column of output bits of the matrix, each of the second plurality of summing modules being coupled to the respective column of the matrix; and
determining a presence of an error in the circuit under test based at least one of an output of the first compressor and an output of the second compressor.

9. The computer program product of claim 8, wherein the matrix comprises M rows and N columns; wherein a number of the first plurality of summing modules is equal to M; and wherein a number of the second plurality of summing modules is equal to N.

10. The computer program product of claim 9, wherein determining the presence of the error in the circuit under test based at least one of the output of the first compressor and the output of the second compressor comprises:
providing outputs of the first plurality of M summing modules of the first compressor to a M-bit first multiple input signature register (MISR);
outputting a first signature by the first MISR based on the outputs of the first plurality of summing modules;
providing outputs of the second plurality of N summing modules of the second compressor to a N-bit second MISR;
outputting a second signature by the second MISR based on the outputs of the second plurality of summing modules; and
determining the presence of the error in the circuit under test based on at least one of the first signature and the second signature.

11. The computer program product of claim 10, further comprising a second circuit under test comprising a copy of the circuit under test, the second circuit under test having an associated second plurality of output bits that are summed by a third compressor, and summed by a fourth compressor, wherein the output of the third compressor is provided to a third MISR, and the output of the fourth compressor is provided to a fourth MISR, and the method further comprising:
comparing a signature of the third MISR to the signature of the first MISR, and determining the presence of the error in the circuit under test based on detecting a difference between the signature of the third MISR and the signature of the first MISR; and
comparing a signature of the fourth MISR to the signature of the second MISR, and determining the presence of the error in the circuit under test based on detecting a difference between the signature of the fourth MISR and the signature of the second MISR.

12. The computer program product of claim 9, wherein determining the presence of the error in the circuit under test based at least one of the output of the first compressor and the output of the second compressor comprises:
providing outputs of the first plurality of M summing modules of the first compressor to a (M+N)-bit first MISR;
providing outputs of the second plurality of N summing modules of the second compressor to the first MISR;
outputting a first signature by the first MISR based on the outputs of the first and second plurality of summing modules; and
determining the presence of the error in the circuit under test based on the first signature.

13. The computer program product of claim 12, further comprising a second circuit under test comprising a copy of the circuit under test, the second circuit under test having an associated second plurality of output bits that are summed by a third compressor and a fourth compressor, and wherein the output of the third compressor and the output of the fourth compressor is provided to a second MISR, and the method further comprising:
comparing a signature of the second MISR to the signature of the first MISR, and determining the presence of the error in the circuit under test based on detecting a difference between the signature of the second MISR and the signature of the first MISR.

* * * * *